United States Patent [19]
Gupta

[11] Patent Number: 5,529,980
[45] Date of Patent: Jun. 25, 1996

[54] MULTILAYER DISTORTED-LATTICE COPPER-OXIDE PEROVSKITE STRUCTURES INCLUDING NDCECUO AND YBACUO MULTI-LAYERS

[75] Inventor: Arunava Gupta, Rockland, N.Y.

[73] Assignee: International Business Machines Corporation, Armonk, N.Y.

[21] Appl. No.: 264,837

[22] Filed: Jun. 23, 1994

Related U.S. Application Data

[63] Continuation of Ser. No. 892,599, May 29, 1992, abandoned, which is a continuation of Ser. No. 420,842, Oct. 13, 1989, abandoned.

[51] Int. Cl.$^6$ ........................................... B32B 9/00
[52] U.S. Cl. ........................ 505/234; 505/701; 428/688
[58] Field of Search ................................. 505/239, 237, 505/234, 701, 702, 703, 704; 428/688, 701, 702, 209

[56] References Cited

U.S. PATENT DOCUMENTS

| | | | |
|---|---|---|---|
| 5,071,828 | 10/1991 | Greuter et al. | 505/725 |
| 5,087,604 | 2/1992 | Shiga et al. | 505/725 |
| 5,096,882 | 3/1992 | Kato et al. | 505/725 |

FOREIGN PATENT DOCUMENTS

| | | | |
|---|---|---|---|
| 0329507 | 1/1989 | European Pat. Off. | H01L 39/22 |
| 0380128 | 8/1990 | European Pat. Off. | H01L 39/12 |
| 1035996 | 2/1989 | Japan . | |
| 1036000 | 2/1989 | Japan . | |
| 64-36000 | 2/1989 | Japan | H05K 3/46 |
| 64-35996 | 2/1989 | Japan | H05K 3/46 |
| 1130584 | 5/1989 | Japan | H01S 3/18 |

OTHER PUBLICATIONS

W. E. Yetter et al., *Journal of Low Temperature Physics*, vol. 49, pp. 227–239, (1982).

A. Segmuller, *Advances in X–Ray Analysis*, vol. 29, pp. 353–366, 1986.

H. A. Borges et al., *Physical review B*, vol. 36, pp. 2404–2407, (1 Aug. 1987).

R. Griessen, *Physical Review B*, vol. 36, pp. 5284–5290, (1 Oct. 1987).

E. Kaspar in Physics and Applications of Quantum Wells and Superlattices, E. E. Mendez and K. von Klitzing, eds., Nato Advanced Study Institutes Ser. B, vol. 170, (Plenum Press, 1987), pp. 101–131.

(List continued on next page.)

*Primary Examiner*—Patrick J. Ryan
*Assistant Examiner*—Patrick R. Jewik
*Attorney, Agent, or Firm*—Daniel P. Morris

[57] ABSTRACT

The present invention concerns a multilayered structure comprising copper-oxide perovskite material having strained crystallographic lattices and altered superconductive properties. The multilayer structure of the invention comprises at least one first layer of a first copper-oxide material and at least one second layer of a second, different copper-oxide perovskite material. The first and second layers are adjacent to one another in an epitaxial lattice-distortion relationship. The first and second copper-oxide perovskite materials in unstressed bulk states define respectively first and second comparison nondistorted crystallographic lattice structures. The first and second comparison nondistorted crystallographic lattice structures have unit cell dimensions which differ in at least one dimension. The first copper-oxide perovskite material in the first layer has a first crystallographic lattice structure which is distorted relative to the first comparison nondistorted crystallographic lattice structure. The second copper-oxide perovskite material in the second layer has a second crystallographic lattice structure which is distorted relative to the second comparison nondistorted crystallographic lattice structure. The first copper-oxide perovskite material in at least one first layer exhibits normal and superconductive states which define a set of normal/superconducting transition parameters. At least one of the normal/superconducting transition parameters differs from a corresponding comparison normal/superconducting transition parameter for the first copper-oxide perovskite material in the unstressed bulk state.

2 Claims, 5 Drawing Sheets

OTHER PUBLICATIONS

R. R. Broussard and T. H. Geballe, *Physical Review B*, vol. 37, pp. 68–74, (1 Jan. 1988).

J. M. Murduck et al., *Applied Physics Letters*, vol. 52, pp. 504–507, (8 Feb. 1988).

D. Ariosa et al., *Physical Review B*, vol. 37, pp. 2421–2425, (15 Feb. 1988).

J. Mannhart et al., *Physical Review Letters*, vol. 61, pp. 2476–2479, (21 Nov. 1988).

M. Tinkham, *Helvetica Physica Acta*, vol. 61, pp. 443–446, (1988).

M. W. McElfresh et al., *Applied Physics A, Solids and Surfaces*, vol. 45, pp. 365–368, (1988).

G. Koren et al., *Applied Physics Letters*, vol. 54, pp. 1054–1056, (13 Mar. 1989).

M. Tonouchi et al., *IEEE Transactions on Magnetics*, vol. 25, pp. 2534–2537, (Mar. 1989).

G. Koren et al., *Applied Physics Letters*, vol. 54, pp. 1920–1922, (8 May 1989).

J.-M. Triscone et al., *Physical Review Letters*, vol. 63, pp. 1016–1019, (28 Aug. 1989).

B. Y. Jin and J. B. Ketterson, *Advances in Physics*, vol. 38, pp. 189–366, (1989).

F. Marsiglio and J. E. Hirsch, *Physica C*, vol. 162–164, pp. 1451–1452, (1989).

J. W. Matthews and A. E. Blakeslee, *Journal of Crystal Growth*, vol. 27, pp. 118–125 (1974).

S. Ami and K. Maki, *Progress of Theoretical Physics*, vol. 53, pp. 1–20 (Jan. 1975).

H. Raffy and E. Guyon, *Physica*, vol. 108B, pp. 947–948 (1981).

Gebulle, Science vol. 259; Mar. 12, 1993, pp. 1550–1551.

Nakajima, Appl. Phys. Lett. 53(15) Oct. 10 1988, pp. 1437–1439.

Koinvma, Jap Journ. Appl. Phys. vol. 26, No. 5, May 1987, pp. L763–L765.

Science vol. 240 pp. 24–27, Apr. 1, 1988.

Sahu et al., Chemistry of High T Superconductors II, Acs 1988 Ch. 1.

Jorgensen et al., Physical Review B. vol. 36 No. 7 Sep. 1, 1987, pp. 3608–3616.

MULTILAYER DISTORTED-LATTICE COPPER-OXIDE PEROVSKITE STRUCTURES INCLUDING NDCECUO AND YBACUO MULTI-LAYERS

CROSS REFERENCE TO RELATED APPLICATION

This application is a continuation of application Ser. No. 07/892,599 filed on May 29, 1992, now abandoned, which is a continuation of application Ser. No. 07/420,842, filed 13 Oct. 1989, now abandoned.

FIELD OF THE INVENTION

The present invention broadly concerns copper-oxide perovskite materials. More particularly, the invention concerns copper-oxide perovskite superconductor materials having strained crystallographic lattices and altered superconductive properties.

BACKGROUND ART

Superconductive copper-oxide perovskite materials have excited great interest because certain of these materials have transition temperatures to the superconductive state which are a higher than previously-known superconductive materials. Although such superconductive materials have transition temperatures and critical current densities which are high enough for many applications, the ability to alter and improve such parameters would be desirable.

It is known that applying a uniform hydrostatic pressure to certain yttrium barium copper oxide superconductive materials can cause the superconductive transition temperature $T_c$ to increase.

A publication by Triscone et al., in *Physical Review Letters*, volume 63, pages 1016 through 1019 (28 Aug. 1989) discloses certain epitaxially grown materials of $YBa_2Cu_3O_7$ and $DyBa_2Cu_3O_7$ described as "superlattice" materials in which planes of dysprosium replace planes of yttrium down to a superlattice "wavelength" of twice the c-axis lattice parameter. It is indicated in the publication that modulation of the rare-earth planes takes place within a Ba-Cu-O matrix and that the 1:2:3 structure "does not care" whether dysprosium or yttrium occupies the rare-earth sites. According to the article, the superconducting properties of the superlattices are as good as single layers, with transition temperatures Tc0 between 85° and 88° K.

SUMMARY OF THE INVENTION

I have invented a multilayered structure comprising copper-oxide perovskite material having strained crystallographic lattices and altered superconductive properties.

The multilayer structure of the invention comprises at least one first layer of a first copper-oxide perovskite material and at least one second layer of a second copper-oxide perovskite material. The first and second layers are adjacent to one another in an epitaxial lattice-distortion relationship. The first copper-oxide perovskite material is different from the second copper-oxide perovskite material.

The first copper-oxide perovskite material in an unstressed bulk state defines a first comparison nondistorted crystallographic lattice structure having first comparison nondistorted unit cell dimensions. The first copper-oxide perovskite material in the unstressed bulk state exhibits normal and superconductive states which define a set of comparison normal/superconducting transition parameters.

The second copper-oxide perovskite material in an unstressed bulk state defines a second comparison nondistorted crystallographic lattice structure having second comparison nondistorted unit cell dimensions. The first and the second comparison nondistorted unit cell dimensions differ in at least one dimension. Preferably the difference in dimension is at least one percent in magnitude. Differences in dimension of three percent, five percent or even more in magnitude may be preferred in certain cases.

The first copper-oxide perovskite material in the first layer has a first crystallographic lattice structure having first unit cell dimensions. The first crystallographic lattice structure is distorted relative to the first comparison nondistorted crystallographic lattice structure, with at least one first unit cell dimension differing by a lattice-distortion amount from a corresponding first comparison nondistorted unit cell dimension.

The first copper-oxide perovskite material in at least one first layer exhibits normal and superconductive states which define a set of normal/superconducting transition parameters. At least one of the normal/superconducting transition parameters differs by a lattice-distortion amount from a corresponding comparison normal/superconducting transition parameter.

The second copper-oxide perovskite material in the second layer has a second crystallographic lattice structure having second unit cell dimensions. The second crystallographic lattice structure is distorted relative to the second comparison nondistorted crystallographic lattice structure with at least one first unit cell dimension differing by a lattice-distortion amount from a corresponding second comparison nondistorted unit cell dimension.

High critical current density property or parameter in superconducting films is desirable for many applications. An advantage of certain preferred multilayer structures of the invention is that the critical current density is increased relative to the critical current density of a film composed of the material of any one of the layers. By using alternating layers of different copper-oxide-perovskite materials-superconductors, for example, the compositions of $YBa_2Cu_3O_{7-\delta}$ and $GdBa_2Cu_3O_{7-\delta}$-high current densities have been achieved. In particular, multilayer structure of the invention made up of alternating layers of the above two materials with each layer, a current-density value of about $4 \times 10^6$ A/cm$^2$ at about 81° K. has been achieved. Moreover, using sandwich layers of substantially different copper-oxide perovskite materials; namely a neodymium cerium copper oxide, which is an electron-doped superconductor, and an yttrium barium copper oxide which is a hole-doped superconductor, similarly high critical current densities have been achieved. For example, a particularly preferred multilayer structure of the invention about 1000 Å thick made up of alternating layers of $YBa_2Cu_3O_{7-\delta}$ and $Nd_{1.83}Ce_{0.17}O_{4\pm y}$ with each layer about 50 Å thick, has exhibited a critical current density of about $2 \times 10^6$ A/cm$^2$ has been achieved at about 80° K. It is expected that high current densities will also be observed in the presence of high magnetic fields.

Multilayer structures of the invention are preferably prepared on (100) oriented $SrTiO_3$ by a laser ablation deposition process. Two alternating ceramic targets are preferably used at a temperature in the range of from about 700° to about 720° C. in about 200 mTorr oxygen.

Conductivity in the copper-oxide perovskite superconductor material $YBa_2Cu_3O_{7-\delta}$ occurs mainly in the crystallographic a-b plane. The highest critical currents in films of such material are also generally obtained when the films are fully oriented with their crystallographic c axis perpendicular to the substrate and have a minimal number of grain boundaries. Although essentially perfect epitaxial single-crystal films with perpendicular c-axis orientation are generally the best, epitaxial films which are polycrystalline with c-axes oriented generally perpendicular to the substrate and with random orientation in the a-b plane are also capable of carrying reasonably high critical currents.

BRIEF DESCRIPTION OF THE DRAWINGS

Preferred embodiments of the invention are described below with reference to the following drawings.

DESCRIPTION OF THE PREFERRED EMBODIMENTS

Multilayer structures of the invention can be prepared in a deposition chamber made of stainlesss steel which is generally cylindrical in shape with a cylinder axis extending vertically, roughly 200 mm in diameter and roughly 400 mm high. The chamber can have five joints approximately 100 mm in diameter with vacuum-tight flanges attached to them. A first flange is located at the top of the deposition chamber for a heated substrate holder. A second flange is located at the bottom for connecting a vacuum pump and pressure gauges. Three flanges are located in an essentially horizontal plane passing midway through the deposition chamber. Axes passing through the three flanges define angles of about 0°, 90° and 135°. Within the 90° flange a rotable dual target holder is located which can hold two ceramic pellets respectively of $YBa_2Cu_3O_{7-\delta}$ and $Nd_{1.83}Ce_{0.17}CuO_{4\pm y}$, about 3 mm thick and about 25 mm in diameter. The other two flanges have fused silica windows about 100 mm in diameter, one for admitting an incoming laser beam at approximately 135° to the surface of the target, and the other to enable side viewing of the plume ablated from the target material and for viewing the substrates when rotated at about 90° to face this window.

Pyrometric determination of the substrate surface temperatures can readily be carried out at the end of each deposition run using an infrared pyrometer (Barnes Optitherm 12-2026) since the surfaces of the hot films are black. The infrared pyrometer temperature measurements can be confirmed by a direct measurement of the film surface temperature, performed with the aid of a small thermocouple attached to the surface of the film. An additional thermocouple can be imbedded in the body of a resistively-heated stainless-steel sample holder, which could be heated to 900° C.

The substrates can be approximately rectangular in shape, about 4 mm×8 mm. The substrates can be glued to the heated sample holder with a silver paste for good thermal contact. Two target pellets can be located on the rotable target holder, with one or the other target pellet rotated to a position facing the substrates and substantially parallel to their surface at a distance of about 45 mm.

A laser ablation technique can be used to deposit high quality films of $YBa_2Cu_3O_{7-\delta}$ and $Nd_{1.83}Ce_{0.17}CuO_{4\pm y}$ on (100) oriented strontium titanate substrates. The relatively close lattice match along the crystallographic a and b-axis of the tetragonal neodymium cerium copper oxide (3.95 Å) with the lattice constant of cubic strontium titanate (3.905 Å) makes the (100) cut of $SrTiO_3$ a suitable for growth of epitaxial films of the oxide.

Pulses of an excimer laser having a wavelength of about 248 nm and a pulse duration of about 8 ns can be used for the ablation process. Two targets can be used, one as a source for the yttrium barium copper oxide layers and the other for the neodymium cerium copper oxide layers.

The neodymium cerium copper oxide target can be an approximately 25-mm diameter sintered pellet of $Nd_{1.83}Ce_{0.17}CuO_4$ prepared from a mixture of $CeO_2$, $Nd_2O_3$ and CuO in proportions to give the desired stoichiometry. The powder can be first calcined in air at about 900° C. for about 32 hrs. The calcined powder can then be pressed into a pellet and sintered at about 1050° C. in air for about 16 hrs and then furnace cooled to room temperature. The yttrium barium copper oxide target can be an approximately 25-mm diameter sintered pellet of $YBa_2Cu_3O_7$ prepared from a mixture of $Y_2O_3$, $BaCO_3$ and CuO in proportions to give the desired stoichiometry. The mixture can be heated in oxygen at about 925° C. for about 8 hours. The resulting material is then reground, pressed into a pellet, and heated to about 900° C. in air for about 16 hours. The pellet may then be furnace cooled slowly to room temperature over eight hours.

The laser pulse repetition rate is variable over the range of from about 1 Hz to 2 Hz. For thin films, say 50 Å thick, the 1 Hz pulse repetition rate is preferred for thicker films, say 200 Å thick, the 2-Hz pulse repitition rate is preferred. The laser beam can be focused down to an area of about 2.5 mm by about 1.5 mm on the surface of the target to produce fluences in the range of from about 2.00 J/cm² to about 3.5 J/cm². Fluences in the range of from about 2.5 to about 3.0 J/cm² are particularly preferred. To obtain film thickness uniformity, the focusing lens can be continuously rastered over an area about 6 mm by about 6 mm of the target. The focusing lens can be mounted on a translation stage and programmed to move horizontally and vertically so as to translate the laser beam in a zig-zag pattern on the pellet. In this way a film thickness uniform to within about ±5 percent over an area of about 15 mm by about 15 mm can generally be obtained. The laser-produced plume for the yttrium barium copper oxide target in about 200 mTorr $O_2$ ambient was purplish in color and had a cross section of about 20 mm diameter on the substrates.

An oxygen pressure of about 200 mTorr is maintained in the chamber. For neodymium cerium copper oxide targets under these conditions, a cone-shaped bluish white plume is produced. The plume can have a cross section of about 20 mm diameter on substrates placed at a distance of about 45 mm from the target.

A vacuum base pressure of about $2\times10^{-6}$ Torr, together with a few $O_2$ flushing cycles prior to each deposition run can be used. During deposition the substrate surface temperature can be kept at about 730° C. and the $O_2$ pressure in the cell at about 200 mTorr. Alternating layers of $Nd_{1.83}Ce_{0.17}CuO_{4\pm y}$ and $YBa_2Cu_3O_{7-\delta}$ can be deposited on the substrate by alternately positioning the neodymium cerium copper oxide pellet and the yttrium barium copper oxide pellet in the path of the laser beam using the rotatable target holder. Occasional $O_2$ flushings can be employed to reduce the accumulation of particulates in the deposition chamber.

At the end of the deposition process, oxygen to about 1 atm can be added slowly to the chamber while the substrate temperature is simultaneously lowered slowly to about 400° C. The films can be left at this temperature for half an hour and then slowly cooled down to room temperature.

Figure 1:
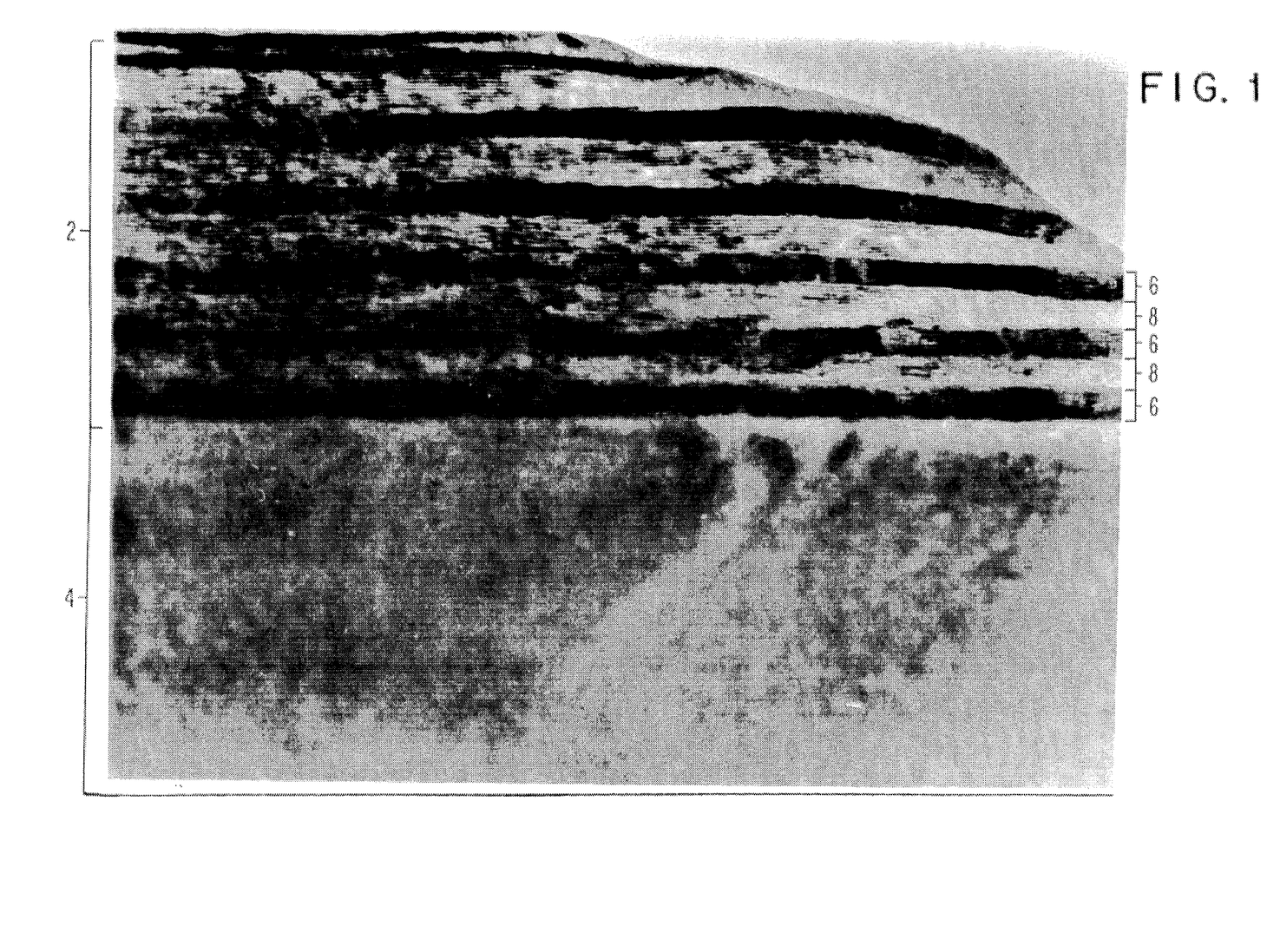
FIG. 1 is a transmission electron micrograph of a slice of a preferred multilayer, substantially-epitaxial structure made up of alternating layers of a neodymium cerium copper oxide and an yttrium barium copper oxide on a substrate of an oriented strontium titanate taken generally crosswise of the layers.

Turning now to FIG. 1, a transmission electron micrograph shows a multilayer epitaxial neodymium cerium copper oxide/yttrium barium copper oxide structure 2 on a strontium titanate substrate 4. The multilayer structure 2 includes alternate layers 6 of $Nd_{1.83}Ce_{0.17}Cu_{O4\pm y}$—which appear as dark bands in the transmission electron micrograph of FIG. 1. Alternating with the neodymium cerium copper oxide layers 6 are layers 8 of $YBa_2Cu_3O_{7-\delta}$—which appear as light bands on the transmission electron micrograph of FIG. 1. The neodymium cerium copper oxide layers 6 are approximately 200 Å thick. The yttrium barium copper oxide layers 8 are approximately 250 Å thick.

Striations may be seen in both the neodymium cerium copper oxide layers 6 and in the yttrium barium copper oxide layers 8 in FIG. 1. The striations are evidently images of individual copper-oxide planes in the two copper oxide perovskite materials. The regularity of the striations and their extent are evidence that both the neodymium cerium copper oxide layers 6 and the yttrium barium copper oxide layers 8 are epitaxial in structure with the crystallagraphic c axis extending normal to the striations in the plane of the Figure. The 200 Å thickness of the neodymium cerium copper oxide layers 6 corresponds to approximately 16 atomic planes. The 250 Å thickness of the layers of yttrium barium copper oxide 8 corresponds to approximately 21 atomic planes.

Figure 2:
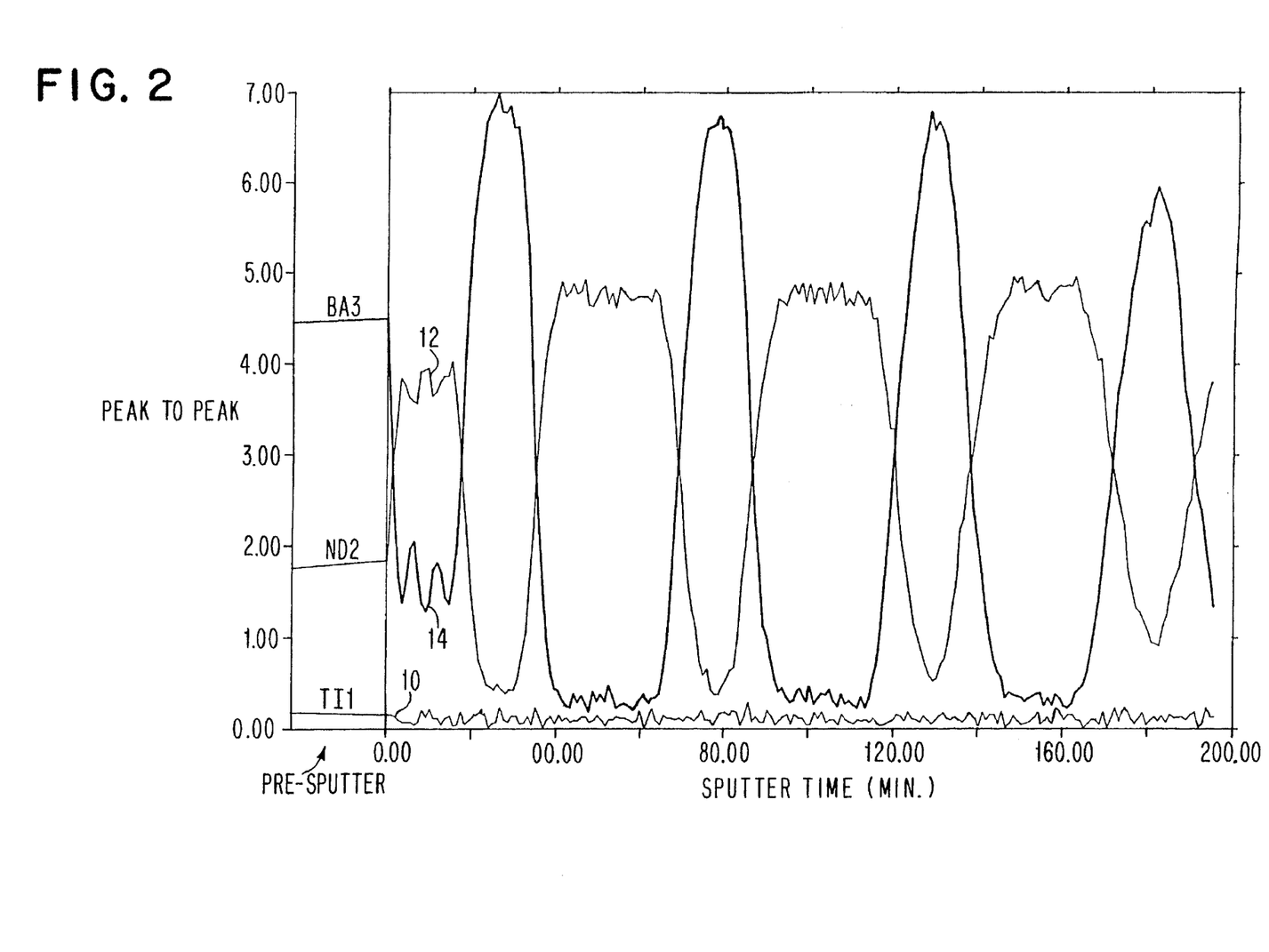
FIG. 2 is an Auger-electron-spectroscopy depth profile of a multilayer substantially-epitaxial structure made up of alternating layers of a neodymium cerium copper oxide and an yttrium barium copper oxide. The depth profile of FIG. 2 is taken generally normal to the layers.

Turning now to FIG. 2, an Auger electron spectroscopic ("AES") profile of a multilayer structure of the present invention on a strontium titanate substrate is shown. The AES profile of FIG. 2 includes three atomic concentration traces: a titanium concentration trace 10 which represents an atomic concentration of titanium, a neodymium concentration trace 12 which represents an atomic concentration of neodymium, and a barium concentration trace 14 concentration which represents an atomic concentration of barium. The three traces 10, 12, 14 are given as a function of sputtering time, which corresponds to a depth within the multilayer structure. As may be seen in FIG. 2, the atomic concentration of barium in the sample varies as a function of depth in an approximately rectangular-pulsed fashion between relatively a low and a relatively high value. The rounding of the rectangular pulses is believed to be due to the non-zero escape depth of the Auger electrons detected by the AES spectrometer. The neodymium concentration also varies in an approximately rectangular-pulsed fashion as a function of depth between a relatively low and a relatively high value. Moreover, the barium and neodymium concentrations vary essentially out of phase with one another and evidence a relatively sharp transition from one concentration to the other, which indicates that the sample is made up of neodymium-containing layers alternating with barium-containing layers. The profile of FIG. 2 also indicates that the concentration of titanium was essentially zero to the depth sampled.

The Auger electron spectroscopic profile of FIG. 2 is consistent with the interpretation that the sample was essentially made up of alternating layers of neodymium cerium copper oxide and yttrium barium copper oxide.

Figure 3:
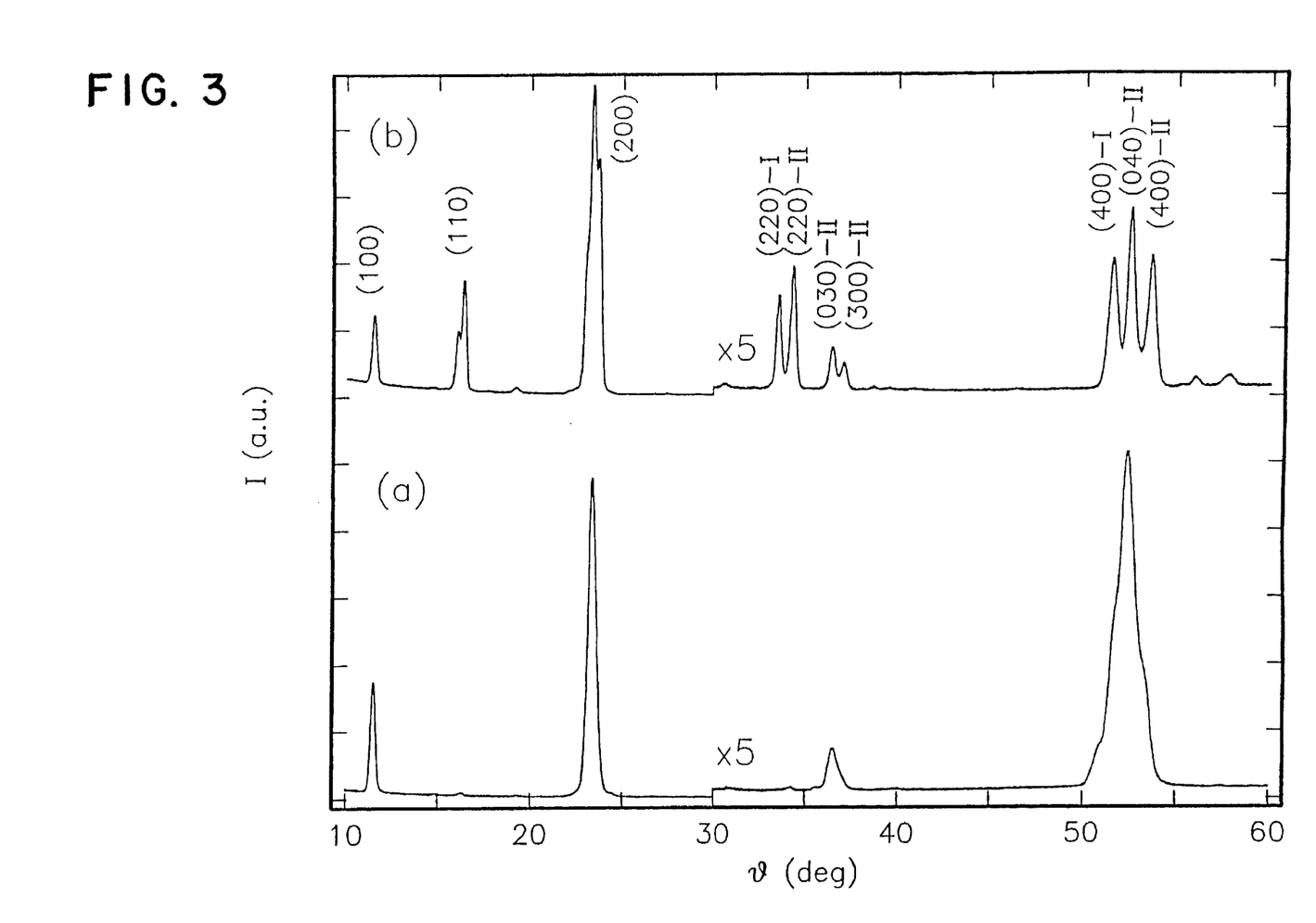
FIG. 3 includes two x-ray diffraction patterns respectively of a first and a second multilayer structure of alternating layers of a neodymium cerium copper oxide and an yttrium barium copper oxide. The first and the second multilayer structures differ in the thickness of the layers.

FIG. 3 shows x-ray defraction patterns of two samples of multilayer structures of neodymium cerium copper oxide layers alternated with layers of yttrium barium copper oxide. In the sample for the lower diffraction pattern, each layer was approximately 200 Å thick. In the sample for the upper diffraction pattern, each layer was approximately 400 Å thick. The reduced number of peaks in the lower diffraction pattern relative to the number of peaks in the upper pattern indicates that the crystallographic lattices of the samples for the respective diffraction patterns differ. In particular, the relatively fewer number of peaks in the upper diffraction pattern indicate that the lattice of the yttrium barium copper oxide material and the lattice of the neodymium cerium copper oxide material distorted one another to form intermediate lattice structures closely similar to each other. At thicknesses of 200 Å, the alternating layers of materials exhibit a coherency strain. In the case of the upper diffraction pattern, the relatively greater number of peaks indicate that at the 400 Å layer thickness, the two materials did not distort to form similar intermediate structures. The layers of materials at the 400 Å thickness evidently developed misfit dislocations and relaxed 40 noncoherency strained structures.

Figure 4:
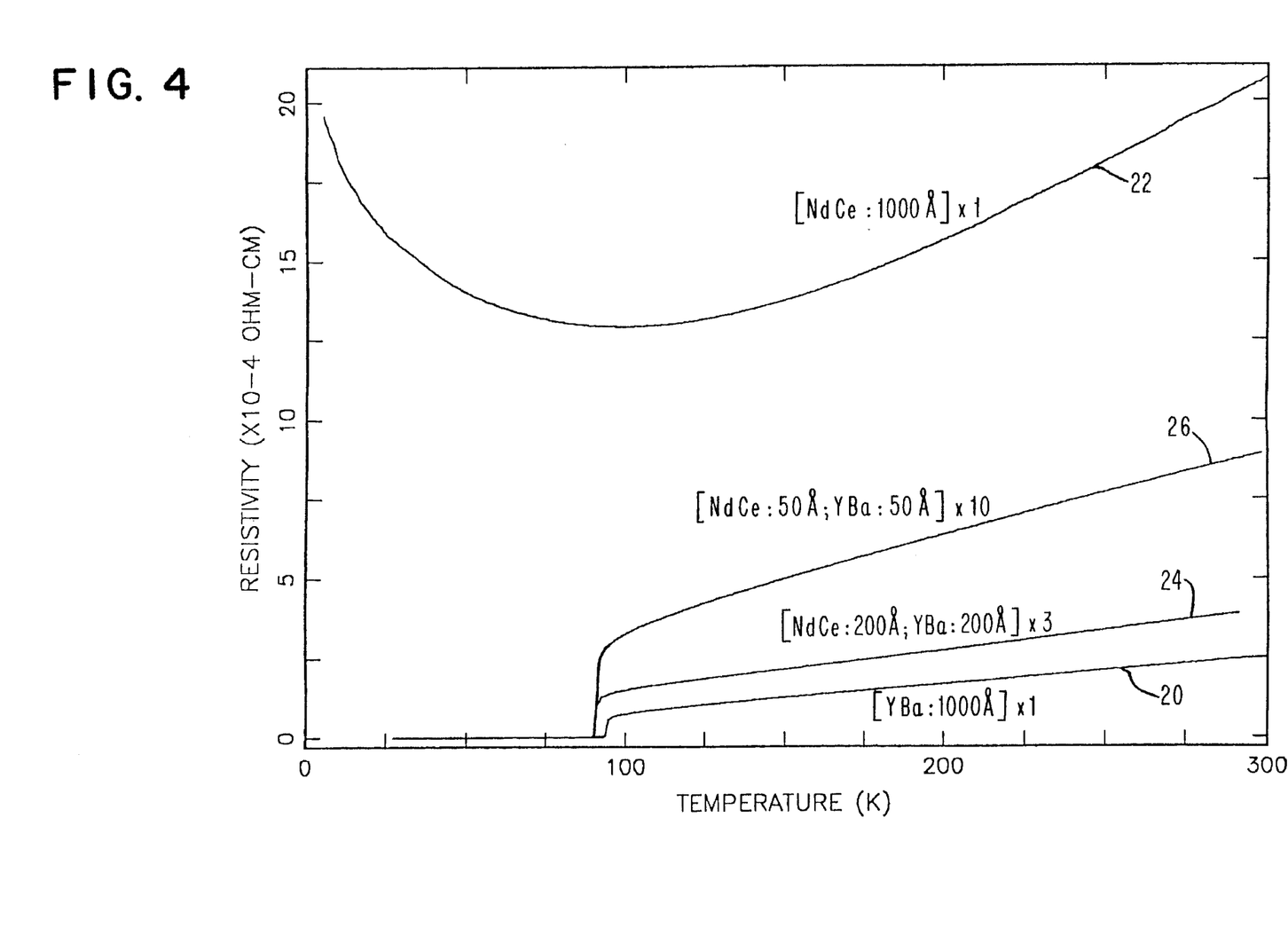
FIGS. 4 and 5 show graphs of changes in resistivity versus temperature at the transition from normal to superconductive states of various films of a neodymium cerium copper oxide, an yttrium barium copper oxide, and multilayer structures of alternating layers of the two copper oxides.

Turning now to FIG. 4, graphs of the resistivity versus temperature of four films of copper oxide material deposited on a strontium titanate substrate where the normal to superconduction resistive transition parameter of the four films shown. Each of the four films is roughly 1000 Å thick. The films consist variously of $Nd_{1.83}Ce_{0.17}CuO_{4\pm y}$ and $YBa_2Cu_3O_{7-\delta}$, either alone or in multilayer structures of alternating layers of the two materials. The neodymium cerium copper oxide material and the yttrium barium copper oxide material were deposited by laser ablation under substantially the same conditions.

Trace 20 on FIG. 4 is a graph of the resistivity versus temperature of a sample of essentially pure $YBa_2Cu_3O_{7-\delta}$. As may be seen from FIG. 4, the resistivity of the sample decreases approximately linearly with absolute temperature to a transition temperature of about 93° K., where the resistivity drops sharply to zero. The film of yttrium barium copper oxide is thus superconductive below the transition temperature. Undistorted or unstressed in bulk $YBa_2Cu_3O_{7-\delta}$ material has an undistorted orthorhombic crystal structure, with the "a" and "b" unit cell dimensions of approximately 3.83 Å and 3.88 Å, respectively, for $\delta$ close to zero.

Trace 22 on FIG. 4 is a graph of the resistivity versus temperature of a film of neodymium cerium copper oxide. The resistivity drops to a minimum at roughly 100° K. and then increases gradually as the temperature decreases further. Under the deposition conditions of this experiment, the neodymium cerium copper oxide film is not superconductive at least down to approximately 5° K. Undistorted or unstressed in bulk $Nd_{1.83}Ce_{0.17}CuO_{4\pm y}$ material has an undistorted tetragonal crystal structure, with the "a" and "b" unit-cell dimensions both approximately equal to 3.95 Å.

Trace 24 on FIG. 4 is a graph of the resistivity versus temperature of a multilayer structure of alternate layers of $Nd_{1.80}Ce_{0.17}CuO_{4\pm y}$ and $YBa_2Cu_3O_{7-\delta}$ on a (100) strontium titanate substrate. The multilayer structure has three layers of each material for a total of six layers. Each of the layers is approximately 200 Å thick. As may be seen in FIG. 4, the resistivity decreases approximately linearly from about 300° K. to a transition temperature of approximately 89° K., where the resistivity drops sharply to zero. The crystallographic lattices of both the neodynium cerium copper oxide layers and the yttrium barium copper oxide layers are distorted relative to the in bulk crystal structures. The "a" and "b" unit cell dimensions in both distorted crystallographic lattices are approximately equal to 3.88 Å.

Trace 26 in FIG. 4 is a graph of the resistivity versus temperature of a multilayer structure of alternate layers of $Nd_{1.83}Ce_{0.17}CuO_{4\pm y}$ and $YBa_2Cu_3O_{7-\delta}$ on a (100) strontium titanate substrate. The multilayer structure has a total of twenty layers, with ten layers being composed of each copper oxide. Each of the layers is approximately 50 Å thick. The resistivity is seen to be greater than the films of traces 20 and 24. The resistivity drops substantially linearly as a function of temperature from about 300° K. to a transition temperature of approximately 89° K., then drops to zero. The crystallographic lattices of both the neodymium cerium copper oxide layers and the yttrium barium copper oxide layers are distorted, with the "a" and "b" unit-cell dimensions approximately equal to 3.88 Å.

It may be seen from FIG. 4 multilayer structures of traces 24 and 26 cause the superconducting transition temperature of the $YBa_2Cu_3O_{7-\delta}$ layers to be reduced by approximately 4° K. The $Nd_{1.83}Ce_{0.17}CuO_{4\pm y}$ layers are believed not to be superconductive down to at least 5° K.

Figure 5:
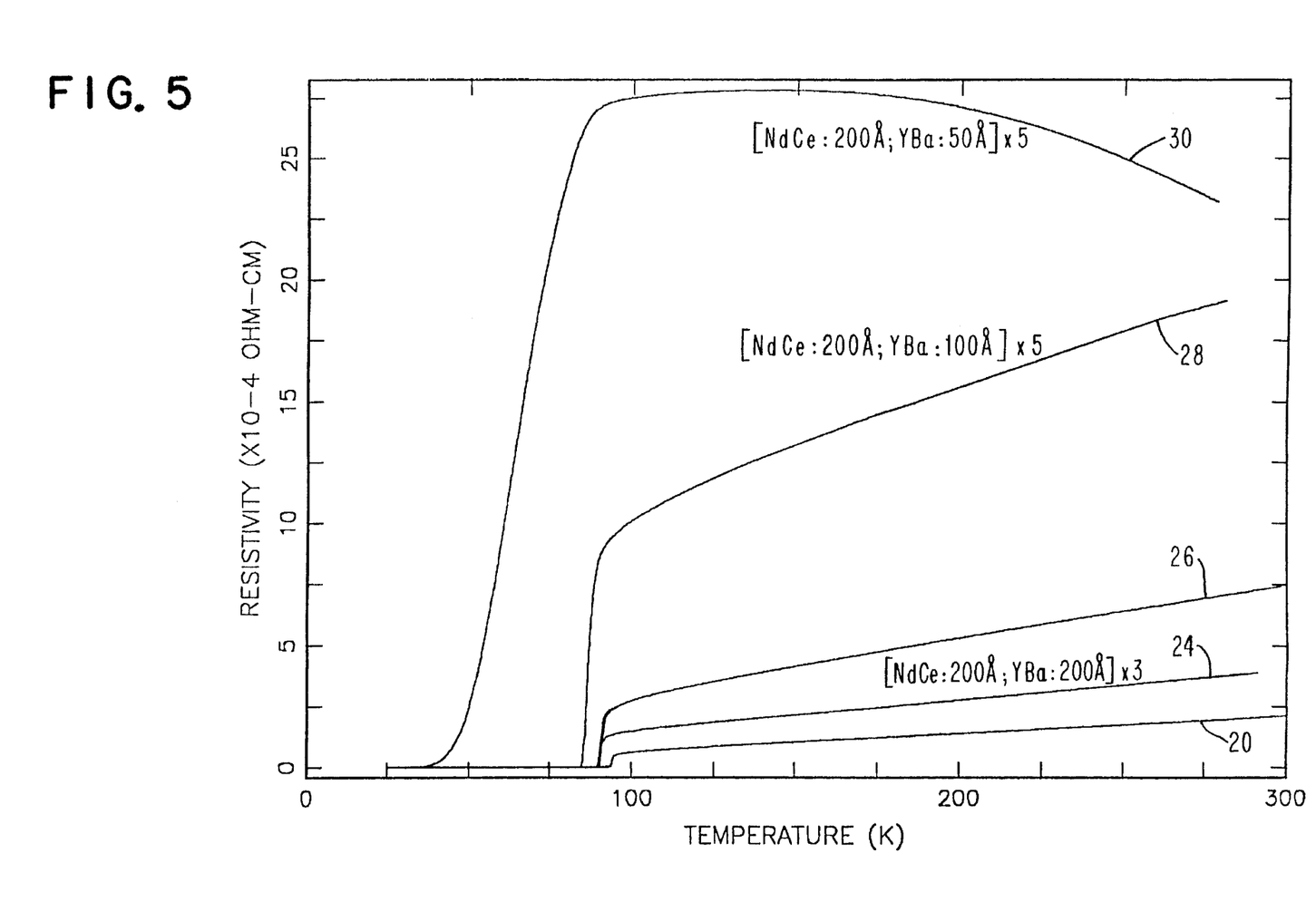

Turning now to FIG. 5, graphs of the resistivity versus temperature of five films of copper oxide material deposited on a strontium titanate substrate is one shown. The films consist variously and $YBa_2Cu_3O_{7-\delta}$ either alone or in multilayer structures with alternating layers of $Nd_{1.83}Ce_{0.17}CuO_{4\pm y}$. The neodymium cerium copper oxide material and the yttrium barium copper material were deposited by laser ablation under substantially the same conditions. Traces 20, 22, and 24 from FIG. 4 are reproduced on FIG. 5 for purposes of comparison.

Trace 28 on FIG. 5 is a graph of the resistivity versus temperature of multilayer structure of alternate layers of $Nd_{1.83}Ce_{0.17}CuO_{4\pm y}$ and $YBa_2Cu_3O_{7-\delta}$ on a (100) strontium titanate substrate. The multilayer structure has five layers of each material for a total of ten layers. Each of the layers of the yttrium barium copper oxide material is approximately 100 Å thick. Each of the layers of the neodymium cerium copper oxide material is approximately 200 Å thick. As may be seen in FIG. 5 the resistivity decreases from about 275° K. to a transition temperature of approximately 83° K., where the resistivity drops to zero. The superconductive transition is broad relative to that of trace 24 for example. The crystallographic lattices of both the neodynium cerium copper oxide layers and the yttrium barium copper oxide layers are distorted relative to their respective bulk crystal structures. The "a" and "b" unit cell dimensions in both distorted crystallographic lattices of the copper oxides of trace 28 are approximately equal to 3.90 Å.

Trace 30 in FIG. 5 is a graph of the resistivity versus temperature of a multilayer structure of alternate layers of $Nd_{1.83}Ce_{0.17}CuO_{4\pm y}$ and Y $Ba_2Cu_3O_{7-\delta}$ on a (100) strontium titanate substrate. The multilayer structure has a total of ten layers, with five layers being composed of each copper oxide. Each of the layers of the neodymium cerium copper oxide material is approximately 200 Å thick. The layers of the yttrium barium copper oxide one each approximately 50 Å thick. The vertical scale has been expanded by a factor of 3 for trace 30 for clarity. As may be seen in FIG. 5, the resistivity increases gradually from about 275° K. to a broad maximum at roughly 145° K., and then decreases to zero.

The superconducting transition for the multilayer structure of trace 30 is the broadest of the materials represented on FIG. 5. The crystallographic lattices of both the neodymium cerium copper oxide layers and the yttrium barium copper oxide layers are distorted relative to their respective bulk crystal structures. The "a" and "b" unit cell dimensions in both distorted crystallographic lattices of the copper oxides of trace 30 in FIG. 5 are approximately equal to 3.92 Å.

It is not intended to limit the present invention to the specific embodiments described above. It is recognized that changes may be made in the materials and processes specifically described herein without departing from the scope and teaching of the instant invention, and it is intended to encompass all other embodiments, alternatives, and modifications consistent with the invention.

I claim:
1. A multilayer structure comprising:
at least one first epitaxial layer of a first copper-oxide perovskite material having a first non-distorted crystallographic lattice structural state with first unit cell dimensions when said first copper-oxide perovskite material is unstressed in bulk, said first copper-oxide perovskite material when unstressed in bulk exhibiting a first set of non-superconducting to superconducting electrical conduction parameters;

at least one second epitaxial layer of a second copper-oxide perovskite material, said second epitaxial copper-oxide perovskite material being different in composition than said first copper-oxide perovskite material and having a second non-distorted crystallographic lattice structural state with second unit cell dimensions which differ from said first unit cell dimensions when said second copper-oxide perovskite material is unstressed in bulk, said second copper-oxide perovskite material when unstressed in bulk exhibiting a second set of non-superconducting to superconducting electrical conduction parameters, said first and second epitaxial layers being deposited one on the other so that crystallographic structures of said first and second copper-oxide perovskite materials in said layers are distorted relative to said first and second non-distorted crystallographic lattice structural states respectfully with at least one of said non-superconducting to superconducting electrical conduction parameters of said multilayer structure differing from a corresponding electrical conduction parameter of said first and second sets of normal to superconducting electrical conduction parameters as a result of the distortion relative to said first and second non-distorted crystallographic lattice structural states in which said first copper-oxide perovskite material is $YBa_2CU_3O_{7-\delta}$;

said first undistorted crystallographic lattice structural state is an orthorhombic crystal structure with "a" and "b" unit cell dimensions of approximately 3.83 Å and 3.88 Å respectively for δ close to zero;

said second copper-oxide perovskite material is $Nd_{1.83}Ce_{0.17}CUO_{4\pm y}$; and said second undistorted crystallographic structural state is an tetragonal crystal structure with "a" and "b" unit cell dimensions approximately equal to 3.95 Å.

2. The multilayer structure of claim 1 wherein:
the distorted crystallographic structures of said first and second copper-oxide perovskite material layers both have "a" and "b" unit cell dimensions approximately equal to 3.88 Å.

\* \* \* \* \*